(12) United States Patent
Blay et al.

(10) Patent No.: US 11,515,089 B2
(45) Date of Patent: Nov. 29, 2022

(54) TOPOLOGY TO REDUCE EFFECTS OF PLATE MISALIGNMENT IN A CAPACITIVE DEVICE

(71) Applicant: Intel Corporation, Santa Clara, CA (US)

(72) Inventors: Genadi Blay, BatYam (IL); Uzi Zohar, Ramat Gan (IL); Ronen Levi, Kiryat Ata (IL)

(73) Assignee: Intel Corporation, Santa Clara, CA (US)

( * ) Notice: Subject to any disclaimer, the term of this patent is extended or adjusted under 35 U.S.C. 154(b) by 171 days.

(21) Appl. No.: 16/914,283

(22) Filed: Jun. 27, 2020

(65) Prior Publication Data

US 2021/0407733 A1 Dec. 30, 2021

(51) Int. Cl.
| | |
|---|---|
| *H01Q 21/00* | (2006.01) |
| *H01G 4/005* | (2006.01) |
| *H05K 1/16* | (2006.01) |
| *H01Q 1/38* | (2006.01) |
| *H05K 1/18* | (2006.01) |

(52) U.S. Cl.
CPC ............ *H01G 4/005* (2013.01); *H01Q 1/38* (2013.01); *H05K 1/162* (2013.01); *H05K 1/18* (2013.01); *H05K 2201/10015* (2013.01)

(58) Field of Classification Search
CPC .......... H01G 4/005; H01Q 1/38; H05K 1/162; H05K 2201/10015
USPC ......................................................... 343/893
See application file for complete search history.

(56) References Cited

U.S. PATENT DOCUMENTS

| | | | | |
|---|---|---|---|---|
| 11,259,367 | B2 * | 2/2022 | Young | ................ H05B 1/0247 |
| 2016/0049720 | A1 * | 2/2016 | Hwang | ................ H01Q 1/243 |
| | | | | 343/702 |
| 2018/0375270 | A1 * | 12/2018 | Jiang | .................. H02M 7/003 |
| 2020/0013562 | A1 * | 1/2020 | Jeong | .................. H01G 11/10 |

* cited by examiner

*Primary Examiner* — Binh B Tran
(74) *Attorney, Agent, or Firm* — Schwegman Lundberg & Woessner, P.A.

(57) ABSTRACT

Apparatuses and methods are provided for a capacitor including two more plates. The capacitor includes one or more teeth cut in an edge of at least one plate of the two or more plates. The one or more teeth extends from the edge of the at least one plate to a point at a length into the at least one plate. Other aspects are described.

25 Claims, 6 Drawing Sheets

TOPOLOGY TO REDUCE EFFECTS OF PLATE MISALIGNMENT IN A CAPACITIVE DEVICE

TECHNICAL FIELD

The disclosure herein relates generally to electrical capacitors, and more particularly to reducing impact of plate misalignment in electrical capacitors.

BACKGROUND

The capacitance of a plate capacitor is based upon the area of the plates and the distance between the plates. As plates become misaligned, due to manufacturing issues or other issues, the effective amount of area decreases and capacitance decreases, reducing the effectiveness of the capacitor.

BRIEF DESCRIPTION OF DRAWINGS

In the drawings, which are not necessarily drawn to scale, like numerals may describe similar components in different views. Like numerals having different letter suffixes may represent different instances of similar components. Some aspects are illustrated by way of example, and not limitation, in the figures of the accompanying drawings in which.

DETAILED DESCRIPTION

The following description and the drawings sufficiently illustrate specific aspects to enable those skilled in the art to practice them. Other aspects may incorporate structural, logical, electrical, process, and other changes. Portions and features of some aspects may be included in, or substituted for, those of other aspects. Aspects set forth in the claims encompass all available equivalents of those claims.

A capacitor is a device that stores electrical energy in an electric field. While the physical form of a capacitor varies, capacitors that will be described herein include at least two electrical conductors often in the form of metallic plates or surfaces separated by a dielectric (nonconducting) medium, which typically includes materials such as glass, ceramic, plastic film, paper, mica, air, and oxide layers. Capacitors have a capacitance, measured in Farads, with the capacitance C of a plate capacitor constructed of two parallel plates being expressed as:

$$C = \varepsilon_0 \frac{A}{d} \quad (1)$$

where A is the area of overlap of the two plates, in square meters; $\varepsilon_0$ is the electric constant (~$8.854 \times 10^{-12}$ F·m$^{-1}$); and d is the separation between the plates, in meters.

As will be appreciated upon examination of Equation (1), capacitance is maximized, for capacitors including plates of a given area, when plates overlap. Multilayer substrate (silicon and/or printed circuit board (PCB)) manufacturing misalignment between layers (e.g., plates) may degrade performance in embedded plate capacitors.

Methods and systems according to aspects reduce or eliminate the impact of misalignment (e.g., misalignment in an x direction, or misalignment in a y direction in a Cartesian coordinate system) between plates. According to example methods, plates are provided with slightly larger overall area, and small cuts, or "teeth" are provided at the perimeters of plates. When misalignment is present the teeth overcome this misalignment and compensate for the capacitance reduction that would otherwise be present due to reduced overlapping area of the plates.

Methods and systems according to aspects can be implemented in any device that makes use of capacitive elements. In some aspects, methods and systems can be used in radio front end modules (RFEMs) of user devices. User devices and corresponding RFEMs are described below with reference to FIG. 1, FIG. 1A, FIG. 2A and FIG. 2B.

Figure 1:
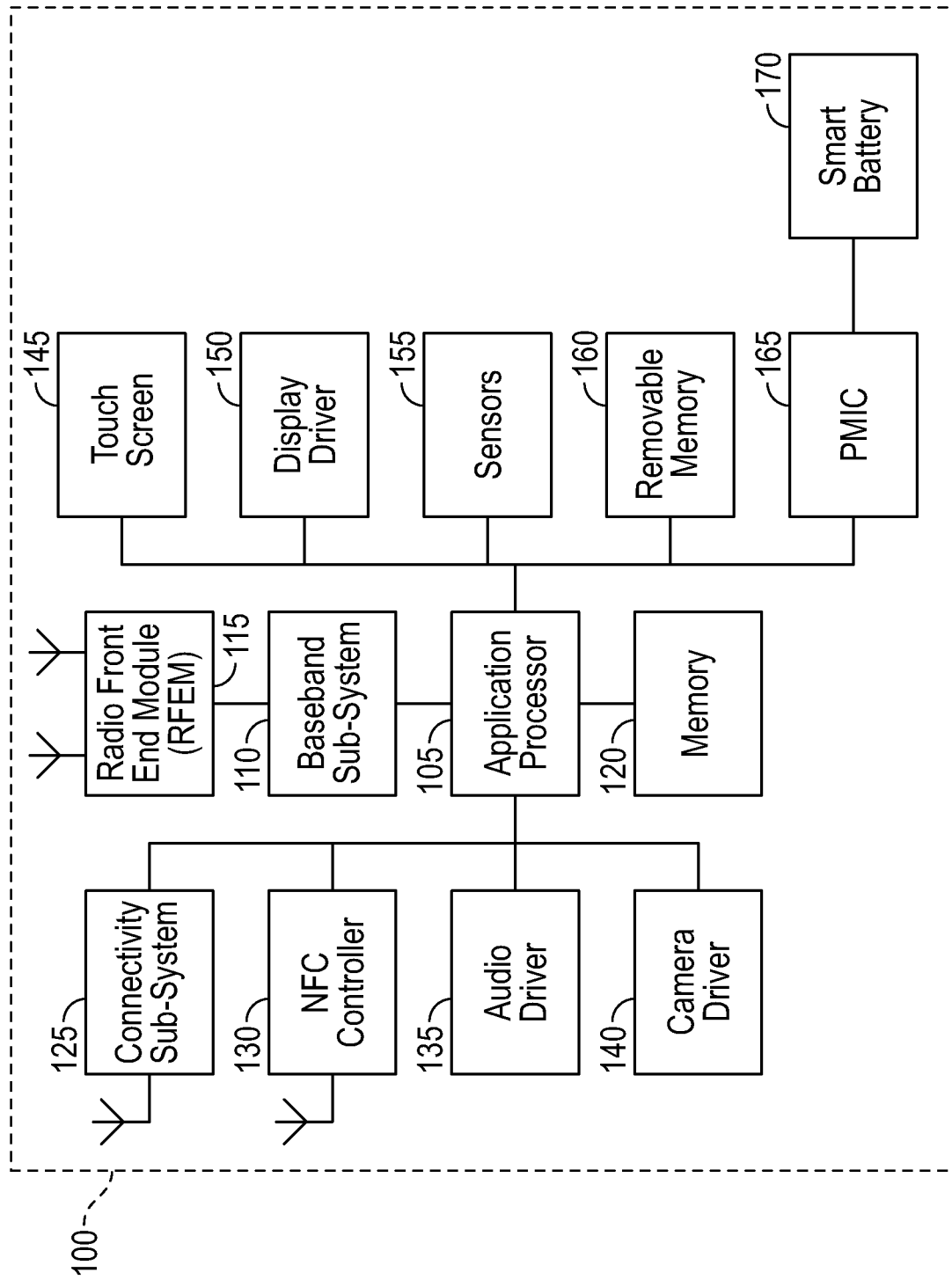
FIG. 1 illustrates an exemplary user device according to some aspects.

FIG. 1 illustrates an exemplary user device according to some aspects. The user device 100 may be a mobile device in some aspects and includes an application processor 105, baseband processor 110 (also referred to as a baseband sub-system), radio front end module (RFEM) 115, memory 120, connectivity sub-system 125, near field communication (NFC) controller 130, audio driver 135, camera driver 140, touch screen 145, display driver 150, sensors 155, removable memory 160, power management integrated circuit (PMIC) 165, and smart battery 170.

In some aspects, application processor 105 may include, for example, one or more central processing unit (CPU) cores and one or more of cache memory, low drop-out voltage regulators (LDOs), interrupt controllers, serial interfaces such as SPI, I2C or universal programmable serial interface sub-system, real-time clock (RTC), timer-counters including interval and watchdog timers, general-purpose IO, memory card controllers such as SD/MMC or similar, USB interfaces, MIPI interfaces, and/or Joint Test Access Group (JTAG) test access ports.

In some aspects, baseband processor 110 may be implemented, for example, as a solder-down substrate including one or more integrated circuits, a single packaged integrated circuit soldered to a main circuit board, and/or a multi-chip module including two or more integrated circuits.

Applications of mmWave technology can include, for example, WiGig and future 5G, but the mmWave technology can be applicable to a variety of telecommunications systems. The mmWave technology can be especially attractive for short-range telecommunications systems. WiGig devices operate in the unlicensed 60 GHz band, whereas 5G mmWave is expected to operate initially in the licensed 28 GHz and 39 GHz bands. A block diagram of an example baseband sub-system 110 and RFEM 115 in a mmWave system is shown in FIG. 1A.

Figure 1A:
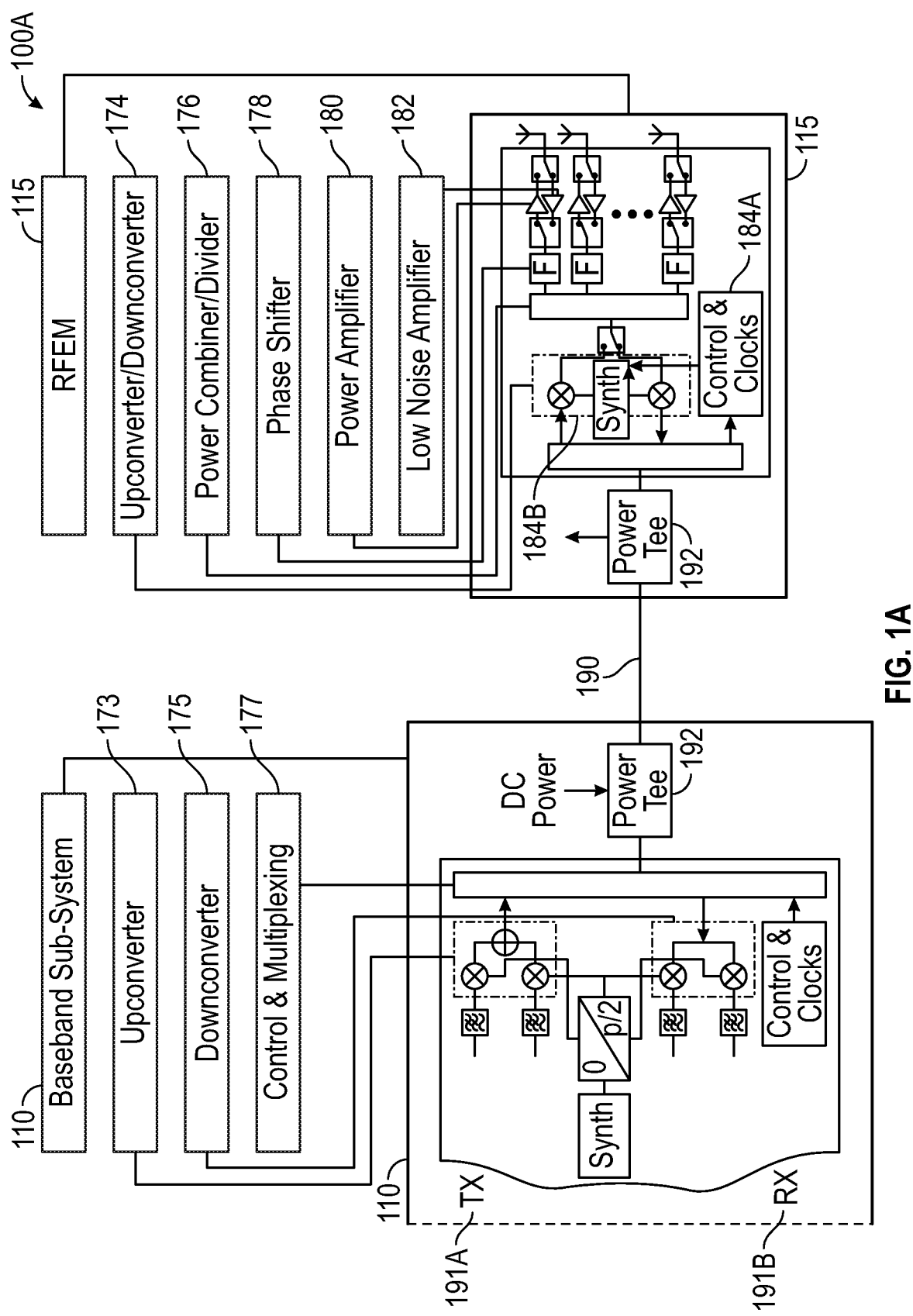
FIG. 1A illustrates a mmWave system, which can be used in connection with the device of FIG. 1 according to some aspects.

FIG. 1A illustrates a mmWave system 100A, which can be used in connection with the device 100 of FIG. 1 according to some aspects of the present disclosure. The system 100A includes two components: a baseband sub-system 110 and one or more radio front end modules (RFEMs) 115. The RFEM 115 can be connected to the baseband sub-system 110 by a single coaxial cable 190, which supplies a modulated intermediate frequency (IF) signal, DC power, clocking signals and control signals.

The baseband sub-system 110 is not shown in its entirety, but FIG. 1A rather shows an implementation of an analog front end. This includes a transmitter (TX) section 191A with an upconverter 173 to intermediate frequency (IF) (around 10 GHz in current implementations), a receiver (RX) section 191B with downconversion 175 from IF to baseband, control and multiplexing circuitry 177 including a combiner to multiplex/demultiplex transmit and receive signals onto a single cable 190. In addition, power tee circuitry 192 (which includes discrete components) is included on the baseband circuit board to provide DC power for the RFEM 115. In some aspects, the combination of the TX section and RX section may be referred to as a transceiver, to which may be coupled one or more antennas or antenna arrays of the types described herein.

The RFEM 115 can be a small circuit board including a number of printed antennas and one or more RF devices containing multiple radio chains, including upconversion/downconversion 174 to millimeter-wave frequencies, power combiner/divider 176, programmable phase shifting 178 and power amplifiers (PA) 180, low noise amplifiers (LNA) 182, as well as control and power management circuitry 184A and 184B. This arrangement can be different from Wi-Fi or cellular implementations, which generally have all RF and baseband functionality integrated into a single unit and only antennas connected remotely via coaxial cables.

This architectural difference can be driven by the very large power losses in coaxial cables at millimeter-wave frequencies. These power losses can reduce the transmit power at the antenna and reduce receive sensitivity. In order to avoid this issue, in some aspects, PAs 180 and LNAs 182 may be moved to the RFEM 115 with integrated antennas. In addition, the RFEM 115 may include upconversion/downconversion 174 so that the IF signals over the coaxial cable 190 can be at a lower frequency. Additional system context for mmWave 5G apparatuses, techniques and features is discussed herein below.

Figure 2A:
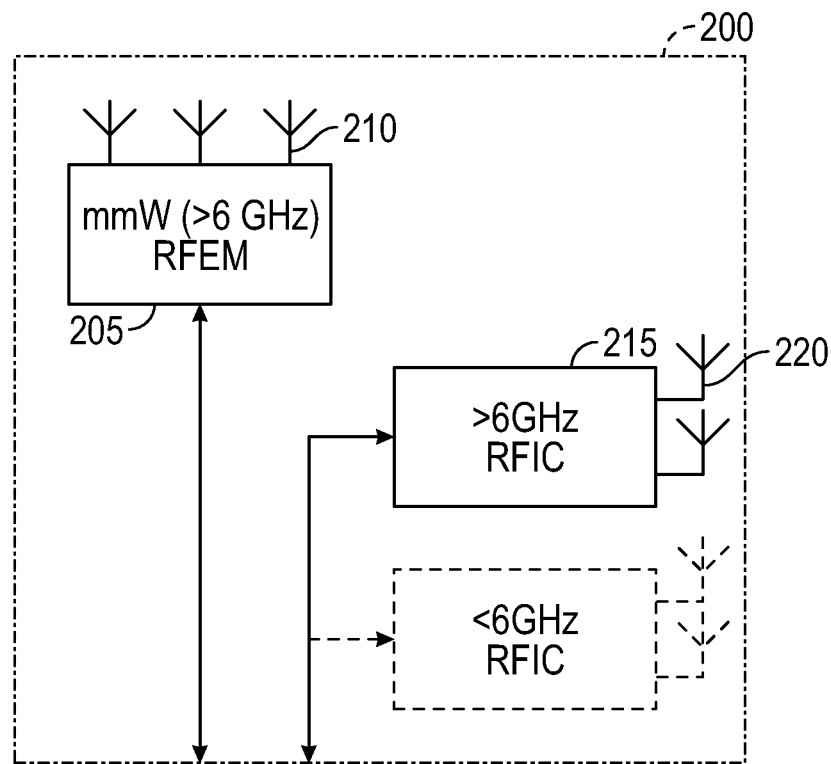
FIG. 2A illustrates an aspect of an exemplary radio front end module (RFEM) according to some aspects.
Figure 2B:
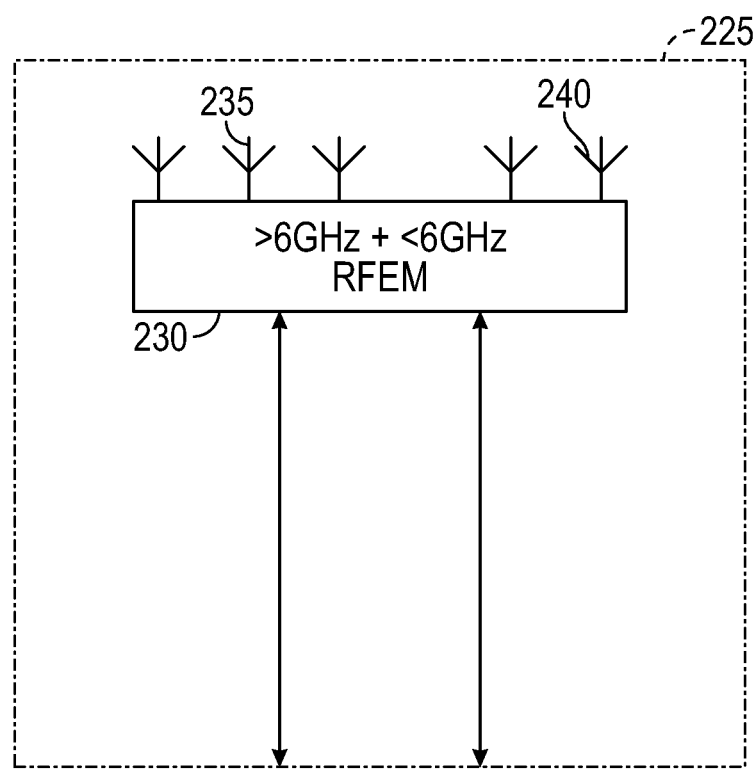
FIG. 2B illustrates an alternate aspect of an exemplary radio front end module, according to some aspects.

FIG. 2A and FIG. 2B illustrate aspects of a radio front end module useable in the circuitry shown in FIG. 1 and FIG. 1A, according to some aspects. FIG. 2A illustrates an aspect of a radio front end module (RFEM) according to some aspects. RFEM 200 incorporates a millimeter-wave RFEM 205 and one or more above-six gigahertz radio frequency integrated circuits (RFIC) 215 and/or one or more sub-six gigahertz RFICs 222. In this aspect, the one or more sub-six gigahertz RFICs 215 and/or one or more sub-six gigahertz RFICs 222 may be physically separated from millimeter-wave RFEM 205. RFICs 215 and 222 may include connection to one or more antennas 220. RFEM 205 may include multiple antennas 210.

FIG. 2B illustrates an alternate aspect of a radio front end module, according to some aspects. In this aspect both millimeter-wave and sub-six gigahertz radio functions may be implemented in the same physical radio front end module (RFEM) 230. RFEM 230 may incorporate both millimeter-wave antennas 235 and sub-six gigahertz antennas 240.

Capacitors in accordance with some aspects can be used in any of the systems described above, and particularly in RFEMs inside a silicon package or on a PCB, as such systems can use embedded capacitors and inductors. During the design of such systems, the X-Y misalignment tolerance is increased. However, X-Y misalignment can cause the capacitance value to vary dramatically, leading to degradation in RF performance. Methods and aspects provide systems and methods to compensate for this manufacturing tolerance.

Figure 3B:
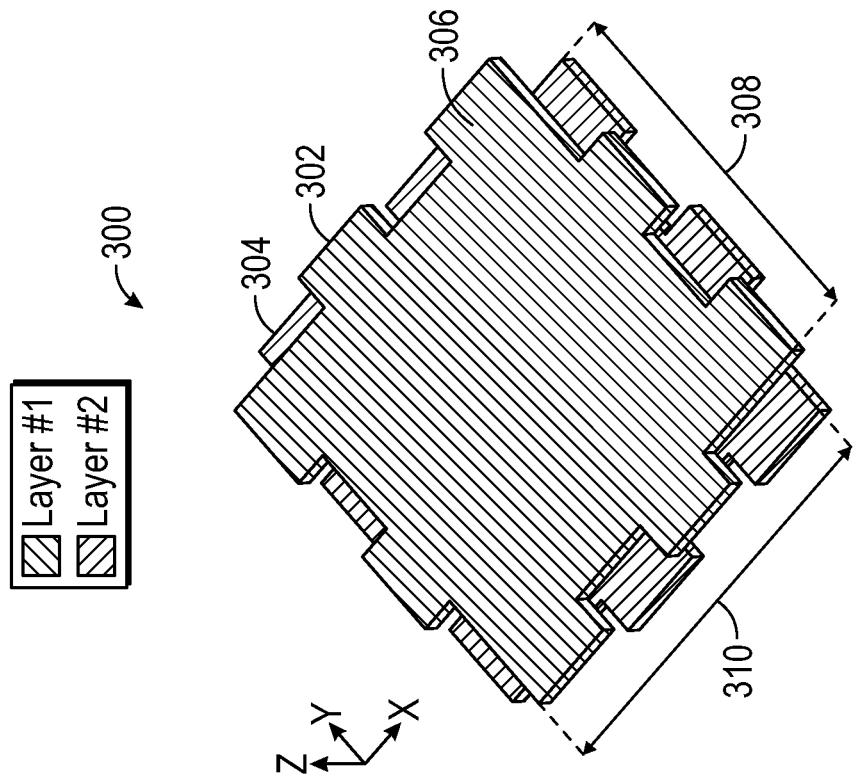
FIG. 3B illustrates a perspective view of a plate capacitor including teeth for misalignment compensation according to some aspects.
Figure 3A:
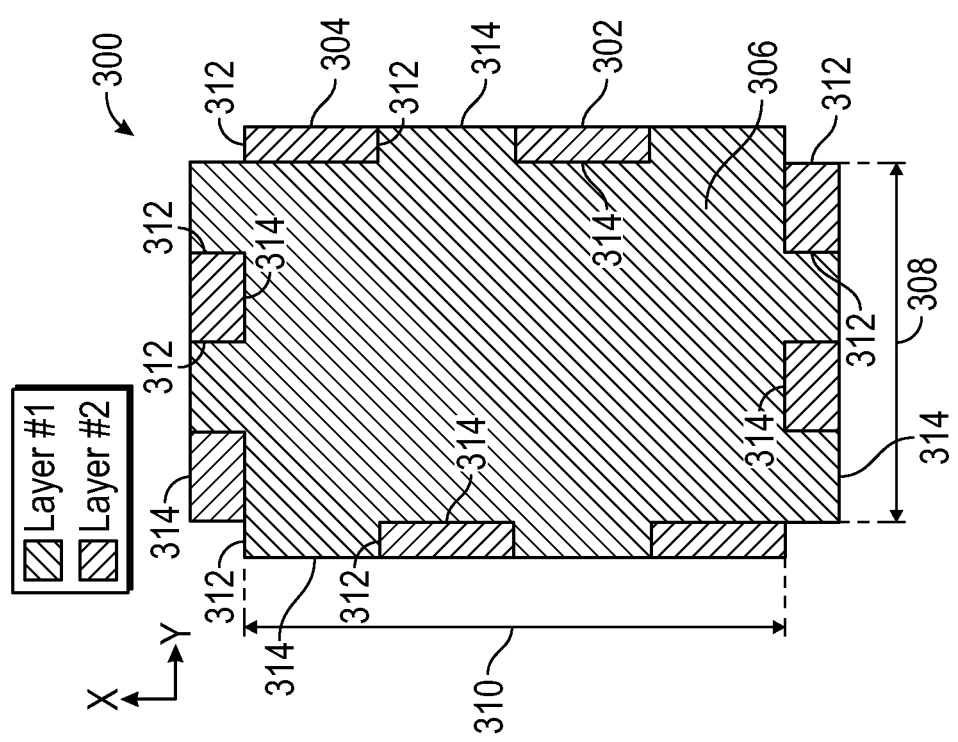
FIG. 3A illustrates a top view of a plate capacitor including teeth for misalignment compensation in accordance with some aspects.

FIG. 3A illustrates a top view of a plate capacitor 300 including teeth 302 for misalignment compensation in accordance with some aspects. As mentioned briefly above, printed capacitors (for example capacitors used in RFEMs described herein) include at least two parallel plates 304, 306 with a dielectric material (not shown in FIG. 3A) between the plates 304, 306. FIG. 3B illustrates a perspective view of the plate capacitor 300 of FIG. 3A. Example values for distance d (see Equation (1)), in most capacitors of sizes as can be included in RFEMs, is about 5-100 μm, and preferably between 5-50 μm. Values can vary depending on manufacturing processes and on the type of materials used for plates and for dielectrics. In example aspects shown in FIG. 3A and FIG. 3B, d can be about 28 μm and plate thickness can be about 18 μm for the metal thickness with a dielectric constant of about 3.5. While teeth 302 are shown as substantially square, teeth can be any shape including triangular shapes or other shapes. Any number of teeth can be used; for example one tooth can be cut into an edge, or a pattern of teeth can be cut. A same number of teeth can be included on each side of each plate, or number of teeth may mismatch.

As can be seen in FIG. 3A, teeth 302 on both capacitor plates 304, 306 are added to overcome X-Y misalignment. When no X-Y misalignment is present, the added teeth does not provide any additional capacitance as the overlapping area between plates is not increased. For example, the length 308 and height 310 of overlap remains the same, and therefore overlapping area remains the same. If some X-Y misalignment is present, due to manufacturing tolerances, these teeth compensate for the capacitance difference as will be described in more detail later herein.

The teeth size can be optimized based on manufacturing tolerance; for example, if X-Y misalignment tolerance is 10 micrometers (μm), the teeth size 312 (e.g., the length of the cut extending into an edge the respective plate, along height dimension 308 or width dimension 310 of the respective plate) will be smaller than if this tolerance is 20 μm. Other tolerances, for example within a range of about 1-100 μm, can be used. In some aspects, teeth size (and particularly teeth length 312) will be equal or about equal to the tolerance. For example, if the maximum tolerance is 10 μm then 10 μm is added to each side of a plate by addition of a tooth, having 10 μm length, on each side of the rectangular plate (e.g., at dimension 312). However, each tooth can be cut any length into the respective plate and be of any width. Teeth may each have different lengths and widths, including at least dimensions 312 and 314 shown, and each side can include any number of teeth with any length and widths. Width 314 may be about 25% the size of the dimension (e.g., height 310), in some aspects, though aspects are not limited thereto.

Figure 4A:
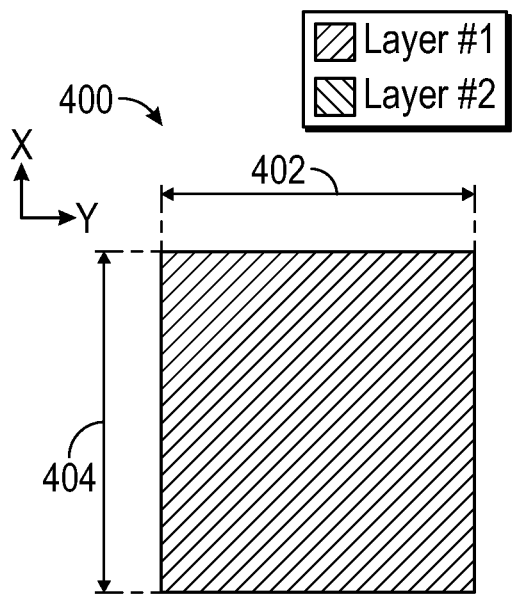
FIG. 4A illustrates a top view of a conventional plate capacitor having aligned plates.

FIG. 4A illustrates a top view of a conventional plate capacitor 400 having aligned plates. Capacitance, based on area of overlap between plates, will be based on length 402 and width 404, which can be used to calculate the area of overlap between the plates.

Figure 4B:
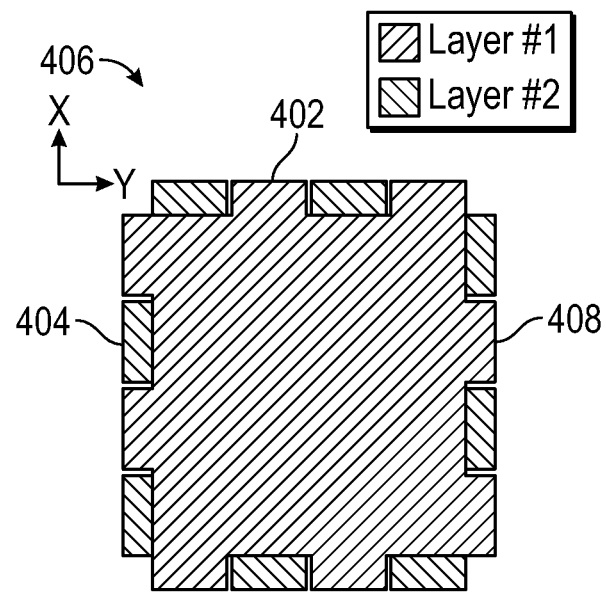
FIG. 4B illustrates a top view of a plate capacitor having aligned plates and including teeth and according to some aspects.

FIG. 4B illustrates a top view of a plate capacitor 406 having aligned plates and including teeth 408 according to some aspects. Capacitance, based on area of overlap between plates, will still be based on length 402 and width 404, as the area under or over teeth 408 will not overlap and therefore will not contribute to overlap area or capacitance calculation.

Figure 4C:
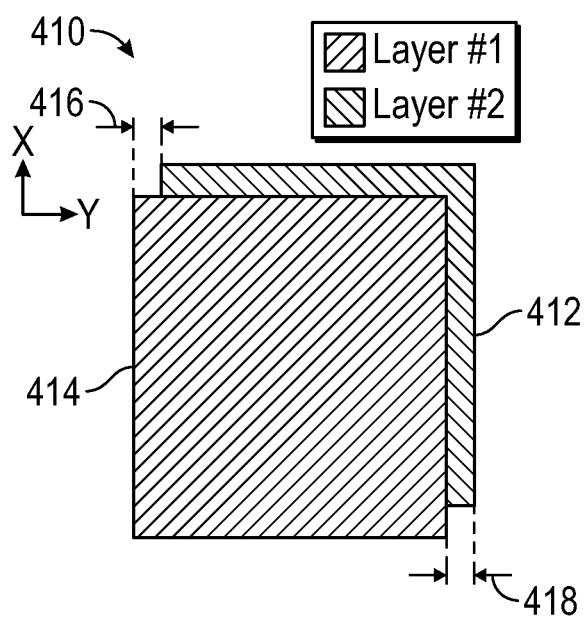
FIG. 4C illustrates a top view of a conventional plate capacitor having misalignment of plates.

FIG. 4C illustrates a top view of a conventional plate capacitor 410 having misalignment of plates 412, 414, meaning the overlap area will be reduced in proportion to the length 416 and width 418 that no longer overlap. Therefore, capacitance is reduced.

Figure 4D:
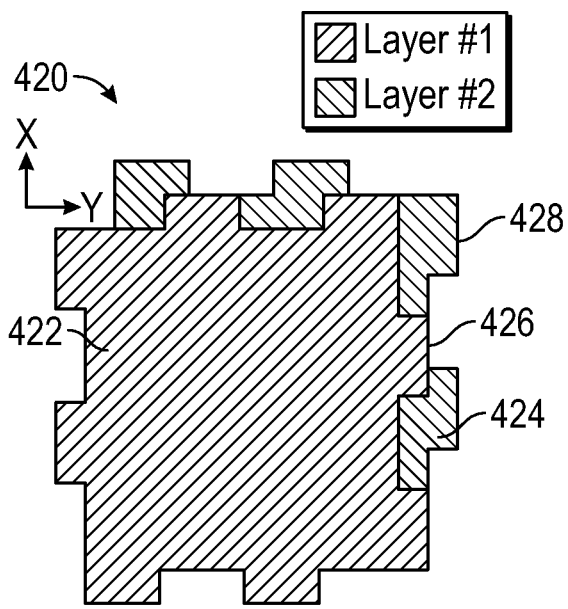
FIG. 4D illustrates a top view of a plate capacitor having misalignment of plates and including teeth and according to some aspects.

FIG. 4D illustrates a top view of a plate capacitor 420 having misalignment of plates 422, 424 and including teeth 426, 428 and according to some aspects. When misalignment is present, one or more teeth 426, 428 of plate 422 or 424 may overlap with area of the opposite plate, thereby increasing the overlap area relative to FIG. 4C and compensating for capacitance loss in accordance with Equation (1). As described earlier, any shape or number of teeth can be used, with length and width varying. Number and size of teeth can be adjusted based on simulations of typical changes in capacitance, on manufacturing data, on manufacturing capabilities, or other factors. Capacitors can include more than two parallel plates, all with varying size and number of teeth. Some of the two or more parallel plates may include no teeth, or differently-shaped teeth, or differently-sized teeth.

Figure 5:
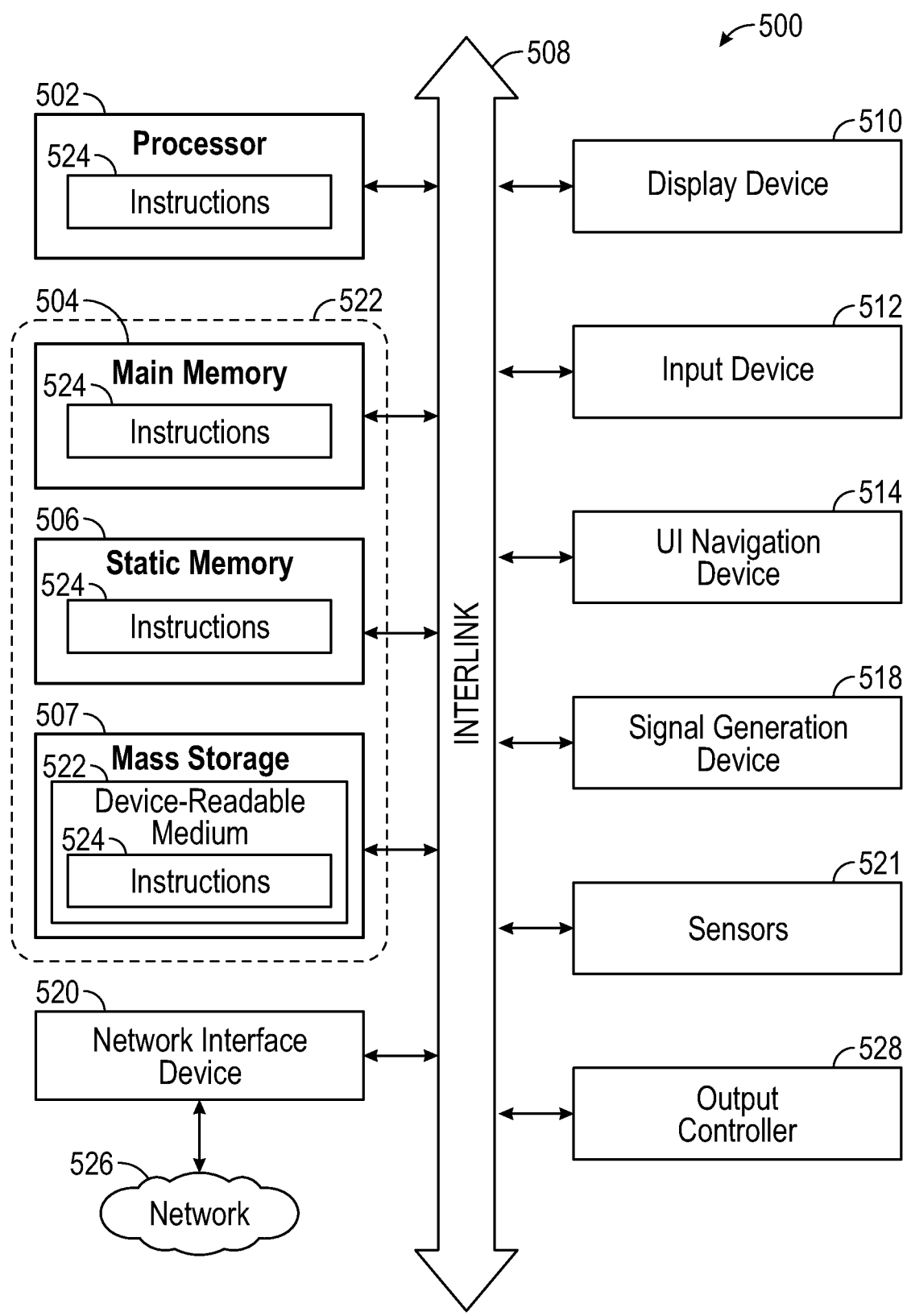
FIG. 5 illustrates a block diagram of an example machine that incorporates the printed circuit board described therein.

FIG. 5 illustrates a block diagram of an example machine 500 that incorporates the printed circuit board described herein. In some examples, portions of the example machine 500 can include one or more capacitors including teeth using methods described herein. In alternative aspects, the machine 500 may operate as a standalone device or may be connected (e.g., networked) to other machines. In a networked deployment, the machine 500 may operate in the capacity of a server machine, a client machine, or both in server-client network environments. In an example, the machine 500 may act as a peer machine in peer-to-peer (or other distributed) network environment. As used herein, peer-to-peer refers to a data link directly between two devices (e.g., it is not a hub-and spoke topology). Accordingly, peer-to-peer networking is networking to a set of machines using peer-to-peer data links. The machine 500 may be a single-board computer, an integrated circuit package, a system-on-a-chip (SOC), personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Machine (e.g., computer system) 500 may include a hardware processor 502 (e.g., a central processing unit (CPU), a graphics processing unit (GPU), a hardware processor core, or any combination thereof), a main memory 504 and a static memory 506, some or all of which may communicate with each other via an interlink (e.g., bus) 508. The machine 500 may further include a display unit 510, an alphanumeric input device 512 (e.g., a keyboard), and a user interface (UI) navigation device 514 (e.g., a mouse). In an example, the display unit 510, input device 512 and UI navigation device 514 may be a touch screen display. The machine 500 may additionally include a storage device (e.g., drive unit) 516, a signal generation device 518 (e.g., a speaker), a network interface device 520, and one or more sensors 521, such as a global positioning system (GPS) sensor, compass, accelerometer, or other sensor. The machine 500 may include an output controller 528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 516 may include a machine readable medium 522 on which is stored one or more sets of data structures or instructions 524 (e.g., software) embodying or utilized by any one or more of the techniques or functions described herein.

The instructions 524 may also reside, completely or at least partially, within the main memory 504, within static memory 506, or within the hardware processor 502 during execution thereof by the machine 500. In an example, one or any combination of the hardware processor 502, the main memory 504, the static memory 506, or the storage device 516 may constitute machine readable media.

While the machine readable medium 522 is illustrated as a single medium, the term "machine readable medium" may include a single medium or multiple media (e.g., a centralized or distributed database, and/or associated caches and servers) configured to store the one or more instructions 524.

The term "machine readable medium" may include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 524 may further be transmitted or received over a communications network 526 using a transmission medium via the network interface device 520 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer networks, among others. In an example, the network interface device 520 may include one or more physical jacks (e.g., Ethernet, coaxial, or phone jacks) or one or more antennas to connect to the communications network 526. In an example, the network interface device 520 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 500, and includes digital or analog communications signals or other intangible medium to facilitate communication of such software.

ADDITIONAL EXAMPLES AND NOTES

In Example 1, an apparatus can include a printed circuit board including a capacitor including two more plates, the capacitor including one or more teeth cut into an edge of at least one plate of the two or more plates, the one or more teeth extending from the edge of the at least one plate to a point at a length into the at least one plate.

Example 2 includes the subject matter of Example 1 and wherein the at least one plate includes a cut pattern of more than one tooth.

Example 3 includes the subject matter of any of Examples 1-2 and wherein at least one tooth of the one or more teeth is substantially square.

Example 4 includes the subject matter of any of Examples 1-3 and wherein at least one tooth of the one or more the teeth is triangular.

Example 5 includes the subject matter of any of Examples 1-4 and wherein the length is a percentage of plate area.

Example 6 includes the subject matter of any of Examples 1-5, and wherein the length is about 5-20 micrometers.

Example 7 includes the subject matter of any of Examples 1-6, wherein the length corresponding to each tooth is substantially the same.

Example 8 includes the subject matter of any of Examples 1-7 wherein a plurality of teeth is made, with at least two teeth having different lengths.

Example 9 includes the subject matter of any of Examples 1-8, wherein the printed circuit board is part of a radio front end module (RFEM).

In Example 10 a method of compensating for plate misalignment in a capacitor including two more plates includes creating one or more teeth in an edge of at least one plate of the two or more plates, the one or more cuts extending from the edge of the at least one plate to a point at a length into the at least one plate.

Example 11 includes the subject matter of Example 10, wherein a cut pattern of more than one tooth is created.

Example 12 includes the subject matter of any of Examples 10-11, wherein at least one tooth of the one or more teeth is substantially square.

Example 13 includes the subject matter of any of Examples 10-12, wherein the length is about 5-20 micrometers.

Example 14 includes the subject matter of any of Examples 10-13 wherein the length corresponding to each tooth is the same.

Example 15 includes the subject matter of any of Examples 10-14 wherein a plurality of teeth is made, with at least two teeth having different lengths.

In Example 16, a system (for example, user equipment, base station equipment, or other equipment) comprises a plurality of antennas; and a circuit board coupled to at least one of the plurality of antennas and including a capacitor including two more plates, the capacitor including one or more teeth in an edge of at least one plate of the two or more plates, the one or more cuts extending from the edge of the at least one plate to a point at a length into the at least one plate.

Example 17 includes the subject matter of Example 16 wherein the at least one plate includes a cut pattern of more than one tooth.

Example 18 includes the subject matter of any of Examples 16-17 wherein at least one tooth of the one or more teeth is substantially square.

Example 19 includes the subject matter of any of Examples 16-18 wherein at least one tooth of the one or more the teeth is triangular.

Example 20 includes the subject matter of any of Examples 16-19 wherein the length is a percentage of plate area.

Example 21 includes the subject matter of any of Examples 16-20, wherein the length is about 5-20 micrometers.

Example 22 includes the subject matter of any of Examples 16-21 wherein the length corresponding to each tooth is the same.

Example 23 includes the subject matter of any of Examples 16-22, wherein a plurality of teeth is made, with at least two teeth having different lengths.

Example 24 includes the subject matter of any of Examples 16-23, wherein the circuit board is part of a radio front end module (RFEM).

Each of these non-limiting examples can stand on its own, or can be combined with one or more of the other examples in any permutation or combination.

The above detailed description includes references to the accompanying drawings, which form a part of the detailed description. The drawings show, by way of illustration, specific aspects in which the invention can be practiced. These aspects are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other aspects can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed aspect. Thus, the following claims are hereby incorporated into the Detailed Description, with each claim standing on its own as a separate aspect, and it is contemplated that such aspects can be combined with each other in various combinations or permutations. The scope of the invention should be determined with reference to the appended claims, along with the full scope of equivalents to which such claims are legally entitled.

What is claimed is:

1. A printed circuit board comprising:
a parallel-plate capacitor including a plurality of plates, the capacitor including at least one tooth extending from each of a plurality of edges of at least one plate of the plurality of plates to form capacitive-compensation teeth, the capacitive-compensation teeth configured to store charge to offset capacitance loss due to plate misalignment.

2. The printed circuit board of claim 1, wherein the at least one tooth has a substantially square shape.

3. The printed circuit board of claim 1, wherein the at least one tooth has a substantially triangular shape.

4. The printed circuit board of claim 1, wherein the at least one tooth includes at least two teeth having different lengths.

5. The printed circuit board of claim 1, wherein the printed circuit board is part of a radio front end module (RFEM).

6. The printed circuit board of claim 1, wherein:
multiple capacitive-compensation teeth extend from the plurality of edges of more than one of the plurality of plates,
the plates are substantially rectangular, and
the capacitive-compensation teeth of a first plate of the plurality of plates do not overlap with the capacitive-compensation teeth of a second plate of the plurality of plates when the first and second plates are aligned.

7. The printed circuit board of claim 6, wherein a distance between a capacitive-compensation tooth of the first plate and a capacitive-compensation tooth of the second plate adjacent to, and on a corresponding edge of, the capacitive-compensation tooth of the first plate is substantially less than at least one of a dimension of the capacitive-compensation tooth of the first plate and a width of the capacitive-compensation tooth of the second plate in a direction of the distance.

8. The printed circuit board of claim 6, wherein the capacitive-compensation teeth of each edge of each of the first and second plate are centered around an offset from a center of the edge.

9. The printed circuit board of claim 1, wherein size and placement of the at least one tooth minimizes a capacitance difference due to misalignment of the plurality of plates and is dependent on a misalignment tolerance of the plurality of plates.

10. The printed circuit board of claim 9, wherein the size of the at least one tooth is substantially equal to the misalignment tolerance of the plurality of plates.

11. The printed circuit board of claim 1, wherein a dimension of the at least one tooth of a particular edge in a direction of a length of the particular edge is proportional to the length of the particular edge.

12. The printed circuit board of claim 1, wherein the at least one tooth of a first edge of a first plate is a mirror image of the at least one tooth of a corresponding edge of a second plate.

13. The printed circuit board of claim 1, wherein the at least one tooth of each edge of each of the plurality of plates is asymmetrically disposed around a center of the edge.

14. The printed circuit board of claim 1, wherein the at least one tooth of each edge of each of the plurality of plates are 180° rotationally symmetric around a center of the plate.

15. A method of compensating for plate misalignment in a parallel-plate capacitor including a plurality of plates, the method comprising:
creating at least one tooth to extend from each of a plurality of edges of each of the plurality of plates to form capacitive-compensation teeth, the capacitive-compensation teeth configured to store charge to offset capacitance loss due to plate misalignment.

16. The method of claim 15, wherein:
multiple capacitive-compensation teeth extend from the plurality of edges of more than one of the plurality of plates,
the plates are substantially rectangular, and
the capacitive-compensation teeth of a first plate of the plurality of plates do not overlap with the capacitive-compensation teeth of a second plate of the plurality of plates when the first and second plates are aligned.

17. The method of claim 16, wherein a distance between a capacitive-compensation tooth of the first plate and a capacitive-compensation tooth of the second plate adjacent to, and on a corresponding edge of, the capacitive-compensation tooth of the first plate is substantially less than at least one of a dimension of the capacitive-compensation tooth of the first plate and a width of the capacitive-compensation tooth of the second plate in a direction of the distance.

18. A system comprising:
a plurality of antennas; and
a circuit board coupled to at least one of the plurality of antennas and including a parallel-plate capacitor including two more plates, the capacitor including at least one tooth extending from each of a plurality of edges of at least one plate of the plurality of plates to form capacitive-compensation teeth, the capacitive-compensation teeth configured to store charge to offset capacitance loss due to plate misalignment.

19. The system of claim 18, wherein:
multiple capacitive-compensation teeth extend from the plurality of edges of more than one of the plurality of plates,
the plates are substantially rectangular, and
the capacitive-compensation teeth of a first plate of the plurality of plates do not overlap with the capacitive-compensation teeth of a second plate of the plurality of plates when the first and second plates are aligned.

20. The system of claim 19, wherein a distance between a capacitive-compensation tooth of the first plate and a capacitive-compensation tooth of the second plate adjacent to, and on a corresponding edge of, the capacitive-compensation tooth of the first plate is substantially less than at least one of a dimension of the capacitive-compensation tooth of the first plate and a width of the capacitive-compensation tooth of the second plate in a direction of the distance.

21. The system of claim 18, wherein size and placement of the at least one tooth minimizes a capacitance difference due to misalignment of the plurality of plates and is dependent on a misalignment tolerance of the plurality of plates.

22. The system of claim 21, wherein the size of the at least one tooth is substantially equal to the misalignment tolerance of the plurality of plates.

23. The system of claim 18, wherein a dimension of the at least one tooth of a particular edge in a direction of a length of the particular edge is proportional to the length of the particular edge.

24. The system of claim 18, wherein the at least one tooth of each edge of each of the plurality of plates is asymmetrically disposed around a center of the edge.

25. The system of claim 18, wherein the at least one tooth of each edge of each of the plurality of plates are 180° rotationally symmetric around a center of the plate.

* * * * *